United States Patent
Prater (10) Patent No.: US 8,350,739 B2
(45) Date of Patent: Jan. 8, 2013

(54) REFERENCE CURRENT COMPENSATION CIRCUIT FOR D/A CONVERTER

(75) Inventor: James Scott Prater, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 112 days.

(21) Appl. No.: 13/072,934

(22) Filed: Mar. 28, 2011

(65) Prior Publication Data

US 2012/0249350 A1   Oct. 4, 2012

(51) Int. Cl.
*H03M 1/10*   (2006.01)

(52) U.S. Cl. ........ 341/120; 327/157; 327/513; 327/532; 327/537; 327/540; 331/16; 363/16

(58) Field of Classification Search .......... 341/120–144; 327/157, 513, 532, 537, 540; 331/16; 363/65
See application file for complete search history.

(56) References Cited

U.S. PATENT DOCUMENTS

| | | | | |
|---|---|---|---|---|
| 5,581,204 A * | 12/1996 | Olsen | ............................. | 327/31 |
| 5,594,373 A * | 1/1997 | McClure | ....................... | 327/108 |
| 5,596,297 A * | 1/1997 | McClure et al. | ............. | 327/538 |
| 5,598,122 A * | 1/1997 | McClure | ....................... | 327/538 |
| 7,193,749 B2 * | 3/2007 | Narushima et al. | ............ | 358/1.9 |
| 7,286,003 B2 * | 10/2007 | Chatterjee et al. | ............ | 327/540 |

\* cited by examiner

*Primary Examiner* — Lam T Mai
(74) *Attorney, Agent, or Firm* — Wade J. Brady, III; Frederick J. Telecky, Jr.

(57) ABSTRACT

A D/A converter having reference node for receiving a reference voltage and together network having a network reference bus connected to the reference node by way of a first electrical connection. The converter network produces a series of reference outputs derived from the reference voltage in response to a digital input applied to the converter, with the converter network sinking a network reference current at the network reference bus which varies with the converter digital input. A reference current compensator circuit is included which provides a compensation current at the network reference bus having a magnitude which varies in response to at least a portion of the digital input, with the compensation current operating to reduce variations in current through the first electrical connection caused by changes in the digital input.

11 Claims, 11 Drawing Sheets

REFERENCE CURRENT COMPENSATION CIRCUIT FOR D/A CONVERTER

BACKGROUND OF THE INVENTION

1. Field of the Invention

The present invention relates generally to data converters and in particular to reference current and circuit common compensation in a digital-to-analog data converter.

2. Description of Related Art

Figure 1:
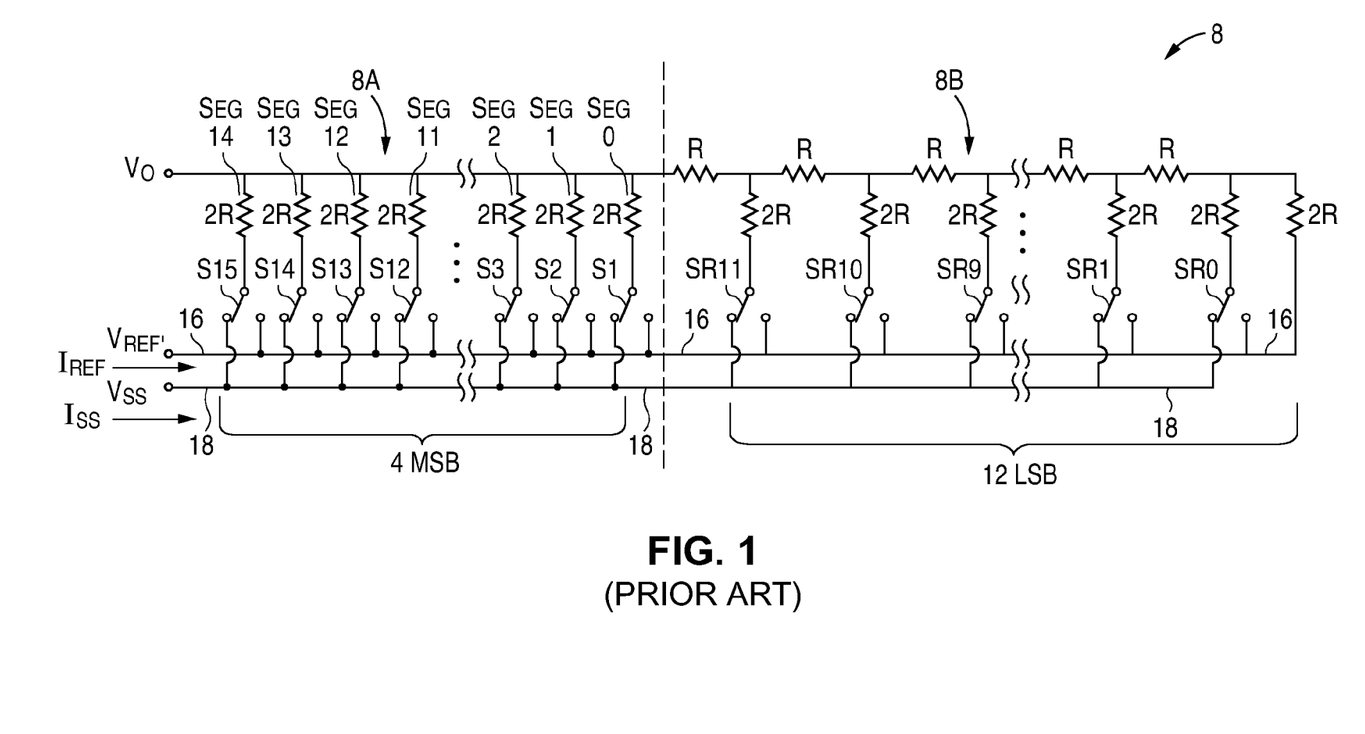
FIG. 1 is a diagram of a segmented resistor ladder network as used in prior art D/A converters.

D/A converters frequently rely upon a reference voltage applied to some sort of resistive ladder network to provide analog output voltages or currents which are a function of the digital input to the converter. One type of resistive ladder is commonly referred to as a R2R ladder which relies on simple binary weighting. However, this approach is not always suitable for data converters having a relatively high resolution due, by way of example, to the tight matching requirements for the ladder resistances. Prior art segmented architectures as shown in FIG. 1 can be used for high resolution applications, where the resistive ladder network includes an MSB section 8A and an LSB section 8B. The 16 bit binary input to be converted is partitioned into 4 MSBs for network 8A and 12 LSBs for network section 8B.

The 4 MSBs for section 8A are decoded from binary to a 15 bit thermometer code (decoder not depicted) which produces 15 bits. Thus, when the binary code is incremented starting at all zeros, the 15 bit thermometer codes changes one bit at a time as follows: 0 . . . 0000 to 0 . . . 0001 to 0 . . . 0011 to 0 . . . 0111 to 0 . . . 1111 until finally 1 . . . 1111. The 15 bits operate to control the state of switches S1 to S15, either connecting an associated 2R resistive segment terminal to a reference voltage Vref bus 16 or to a circuit common Vss bus 18. The resistive segments of section 8A are sometimes referred to herein as segments 1-15, with the R2R LSB section 8B being collectively referred to herein as segment 0.

The 12 LSBs for section 8B are not decoded but are used directly to control the states of respective switches SR0 to SR11. These switches operate to connect the associated 2R resistance to either the reference voltage Vref bus 16 or the circuit common Vss bus 18. The two sections 8A and 8B are connected to a common output Vo which is then fed to an output amplifier as will be described.

Figure 2:
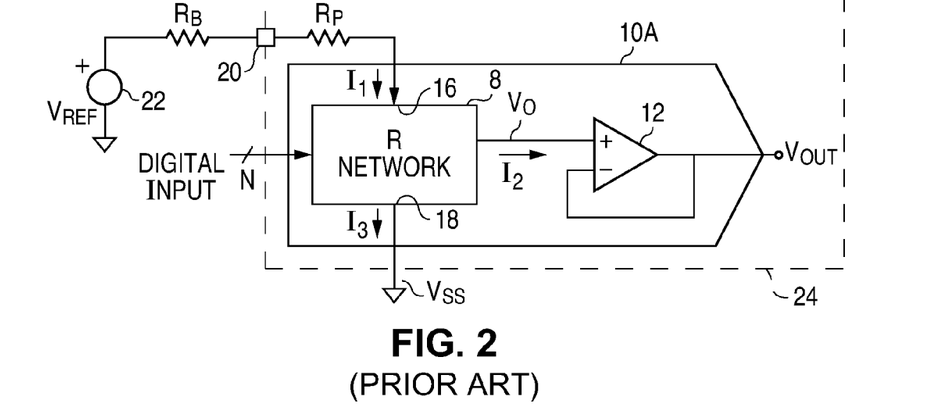
FIG. 2 is a prior art D/A converter that utilizes the ladder network of FIG. 1 in a voltage mode configuration.

The FIG. 1 resistive ladder network 8 can be used to operate in either a voltage or a current mode, depending upon the configuration of the output amplifier. FIG. 2 shows a prior art D/A converter 10A using network 8 in the voltage mode configuration. The output Vo of the network is connected to the input of an operational amplifier 12 configured as a unity gain buffer. The buffer presents a high input impedance to the output of the ladder network so that no current is drawn out of the network output Vo, i.e., I2=0. Thus, output voltage Vout of buffer 12 has a magnitude which is equal to the Thevenin equivalent voltage produced by the network for a given digital input.

Figure 3:
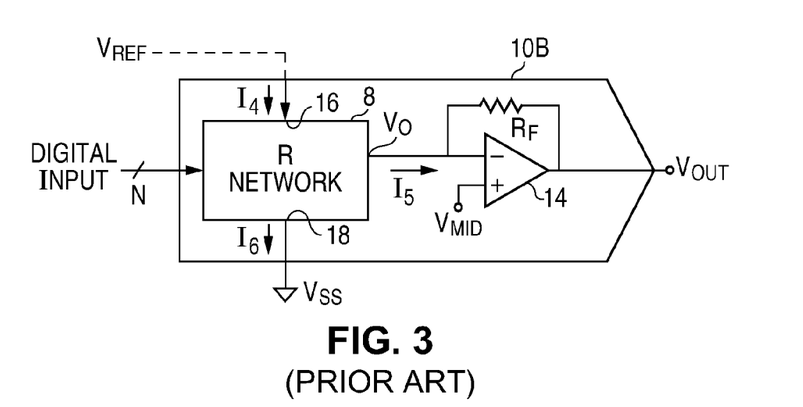
FIG. 3 is a prior art D/A converter that utilizes the ladder network of FIG. 1 in a current mode configuration.

FIG. 3 shows a prior art D/A converter 10B which includes the FIG. 1 resistive ladder network 8 configured to operate in a current mode. In this case the output Vo of the ladder network 8 is connected to the inverting input of an operational amplifier 14. Feedback provided by resistor Rf forces the amplifier inverting input voltage to be equal to the non-inverting input voltage Vmid, with Vmid typically being Vref/2 when only a positive supply is being used. Unlike the voltage mode configuration, the current mode configuration produces a current I5 from network 8 which is essentially the analog output of the converter. This output current is converted to a voltage dropped across resistor Rf to produce the output Vout which varies about the mid-voltage Vref/2.

Both of the voltage and current mode configurations are capable of providing good performance. FIG. 2 shows the voltage mode converter 10A implemented in integrated circuit (IC) form, with the boundaries of the IC being depicted by block 24. As is common, the reference voltage source 22 is disposed outside the IC, typically on the same circuit board on which the IC is mounted. The resistive ladder network 8 draws a current I1 from the source 22. It has been found that this current results in a voltage drop across the electrical connection resistance $R_B$ between the source 22 and the IC terminal 20 for receiving Vref. In addition, current I1 further results in a voltage drop across a parasitic resistance $R_P$ within the IC between the terminal 20 and the reference voltage bus 16. As shown in FIG. 1, bus 16 distributes the reference voltage throughout both the MSB portion 8A and the LSB 8B portion of the resistive ladder network.

Figure 4:
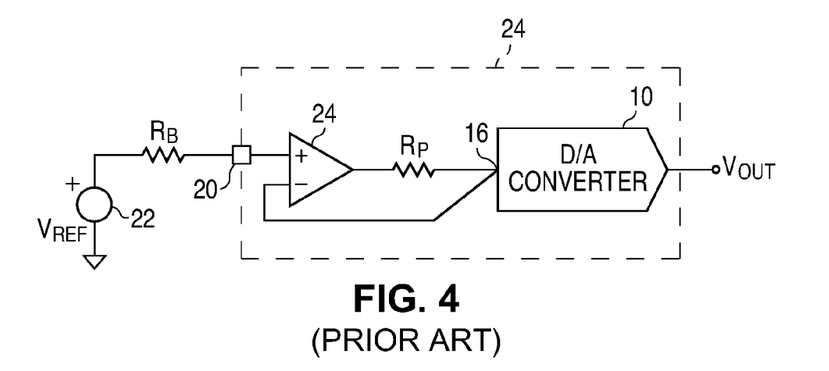
FIG. 4 is a D/A converter that utilizes a prior solution for eliminating voltage drops in the electrical connection to a voltage reference source.

The voltage drops across resistors $R_B$ and $R_P$ can be sufficiently significant to appreciably reduce the accuracy of the D/A converter 10A. FIG. 4 illustrates one prior art solution to this problem. The integrated circuit 24 is provided with an operational amplifier 24 configured as a non-inverting unity gain buffer. The reference voltage originating from the source 22 external to the IC is again applied to the IC terminal 20 by way of an electrical connection that has a resistance $R_B$. The non-inverting input of amplifier 24 is also connected to the terminal 20, with the inverting input connected to the reference voltage bus 16 of the network so that essentially all of the electrical connection having resistance $R_P$ is disposed between the non-inverting input and the output of the amplifier. Since the amplifier input is a high impedance, no current is drawn through resistance $R_B$ so that the voltage at terminal 20 is almost exactly voltage Vref. The high amplifier gain in combination with the feedback will force the inverting input voltage to be equal to that of the non-inverting input. Thus, the voltage Vref at the reference voltage bus 16 will be maintained at Vref regardless of any current flow through resistance $R_P$.

Although the FIG. 4 solution eliminates errors due to variations in the reference voltage at the ladder input 12, the operational amplifier, which must be of a relatively high performance, can add noise to the system and consumes additional power. In addition, this approach requires that Vref be maintained below the amplifier supply voltage. The various embodiment of the present invention provide an alternative solution to this problem as will become apparent to those skilled in the art upon a reading of the following Detailed Description of the Invention together with the drawings.

DETAILED DESCRIPTION OF THE INVENTION

Figure 5:
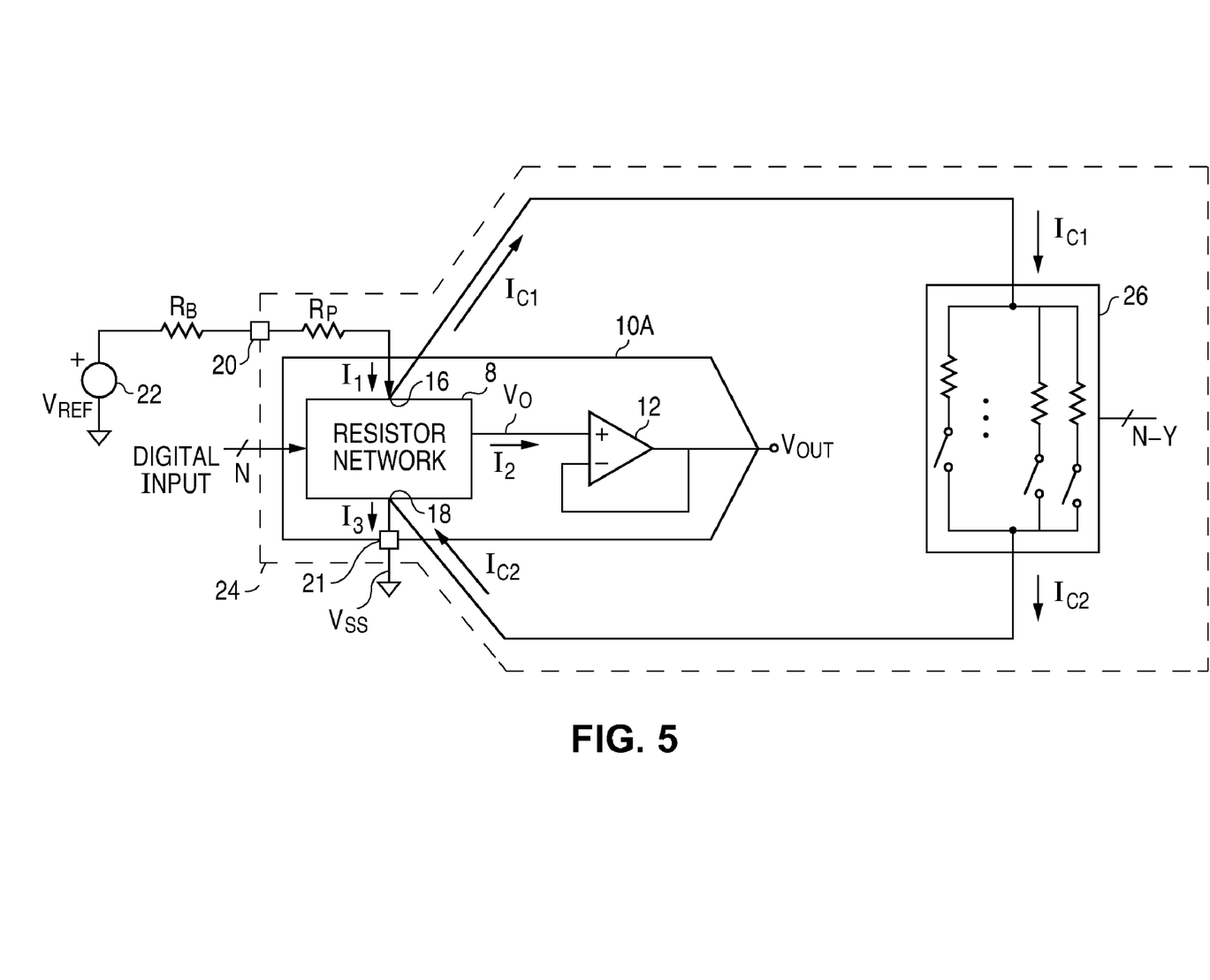
FIG. 5 is a diagram of a voltage mode D/A converter in accordance with one embodiment of the present invention that utilizes reference current and common current compensation circuitry.

Referring again to the drawings, FIG. 5 shows a D/A converter in accordance with one embodiment of the present invention. The basic converter 10A is as depicted in FIG. 2. As previously described, the resistor network 8 of the converter draws a current from the reference voltage bus 16. As shown in FIG. 1, the current Iref flows starting at the reference voltage bus 16 through both the MSB portion 8A and the LSB portion 8B of the resistive ladder network 8. Since the FIG. 5 converter is configured for voltage mode operation, there is no current flow out of the Vo terminal so that current Iref is equal to the current Ivss out of the circuit common bus 18.

Figure 8:
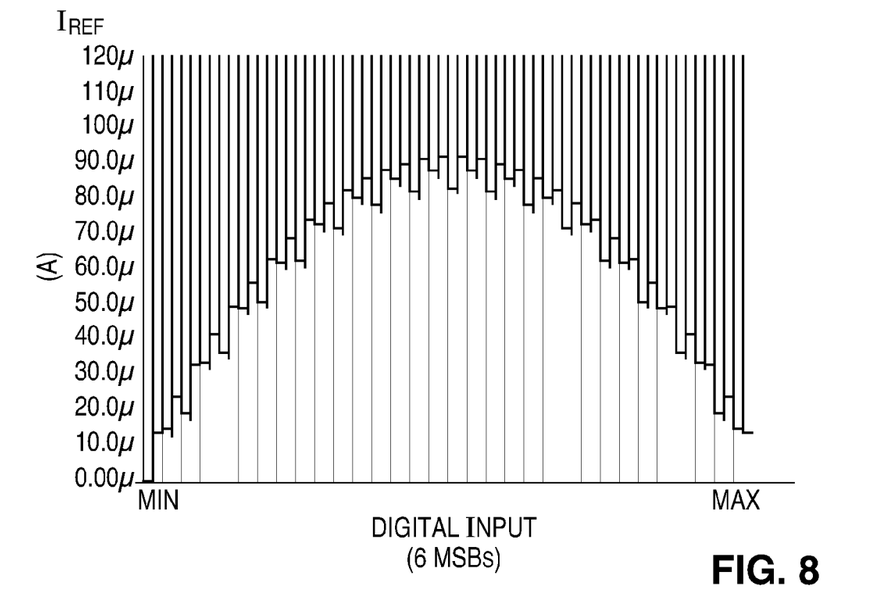
FIG. 8 is a graph depicting variations in the current drawn by the resistor network of the voltage mode D/A converter of FIG. 5 versus changes in the digital input.

The magnitude of current Iref is a function of the digital input to the D/A converter, with the input comprising N number of binary weighted bits. Assuming that the value of R is 60 KΩ and 2R is 120 kΩ and assuming that Vref is +2.5 volts, the current flow Iref can vary from approximately 0 to 92.3 μA depending upon the digital input. FIG. 8 is a graph showing the values of Iref as the digital input is swept from a minimum value on the left to a maximum value of the right. Although only the six MSBs are swept, the 64 different current valued depicted are a good representation of the Iref current over the entire 16 bit range. The minimum current Iref value of 0 μA occurs at both the minimum and maximum digital values, with the maximum current value being located midrange. Assuming that the total resistance $R_B$ plus $R_P$ is about 0.5Ω, the value of the output Vo of the resistor network 8 will vary from 0 to 46 μV as a result of variations in the voltage at the reference voltage bus 16. Given that the D/A converter output Vout is equal to KVo where K is a constant, it can be seen that this variation in Vo is very significant since it is greater than one LSB for this 16 bit D/A converter.

In accordance with one aspect of the present invention, a current compensation circuit 26 is provided having a current input connected to the reference voltage bus 16 of resistor network 8. As previously noted, since the reference voltage Vref at external source 22 differs from the voltage on bus 16 due to voltage drops between the two points, the voltage on bus 16 sometimes being referred to herein as Vref'. The currents at the node on bus 16 can be expressed as follows:

$$I1 = Iref + Ic1 \quad (1)$$

where,
  I1 is the current flow through the electrical circuit connecting the Vref source 22 to bus 16;
  Iref is the current flow through the resistor network 8 starting at the Vref' bus 16; and
  Ic1 is the compensation current drawn by compensation circuit 26.

In order to improve converter accuracy, the value of the current Ic1 of the compensation circuit is controlled so as to compensate for variations in Iref such that current I1 is relatively fixed and does not change substantially with the digital input to the D/A converter 10A. Compensation circuit 26 is configured to control compensation current Ic1 so that variations in Iref due to changes in the digital input are offset by changes in Ic1. In order to provide this compensation, changes in current Ic1 provide a complement to changes in current Iref so that variations in the net current, current I1, are substantially reduced.

One approach for implementing the compensation circuit 26 is to first characterize the various Iref currents of a particular resistive ladder network for the various digital inputs to the D/A converter as is shown in FIG. 8. This can be done by direct current measurements on the D/A converter itself or by simulating the converter using well know circuit simulation programs to determine the values of Iref. In order to implement the current compensation circuit, a determination then needs to be made as to the magnitude of various compensation currents Ic1, such that when combined with the Iref values, produce the various compensated currents I1 which have a substantially reduced variation in magnitude. The number of different compensating currents and the precision of the currents can be adjusted in accordance with the desired overall accuracy of the compensation. The compensation circuit can then be implemented so as to produce the various compensating currents Ic1 for each digital input to the D/A converter. Since absolute precision is not needed, a unique Ic1 value need not be produced for each digital input, with one value of Ic1 typically being suitable for a range of digital inputs as will be described.

Further details regarding D/A converter 10A operation in the voltage mode will now be described. The code space for voltage mode operation is divided into sixteen regions, numbered from 0 to 15. The fifteen 2R resistive segments in the MSB section of the ladder network connected to respective switches S1-S15 are referred to herein as segments ("seg") 1-15 with the R2R network in the LSB section 8B being collectively referred to as segment 0. With the MSB bits all zero (0000), the converter is in region 0 where segment 0 is active. As previously noted, the MSBs are decoded to produce fifteen control lines (referred to as top <15:1>) in a thermometer coded form which operate to control the states of respective switches S1 to S15. Thus, in region 0 all of the fifteen resistive segments in section 8A are switched to the Vss bus 18 so that the converter output Vout is in its lowest range. The minimum output voltage Vout is obtained when all bits, MSB+LSB, are zero. When the MSBs are incremented by one to 0001 the converter exits region 0 and enters region 1. In region 1, one resistive segment (segment 1) is connected to the Vref' bus 16 by switch S1 and all other segments connected to the Vss bus 18. This is sometime referred to as the "seg 1" decode. When the MSBs are again incremented entry is made into region 2 where both resistive segments 1 and 2 are connected by respective switches S1 and S2 to the Vref' bus 16, with the other segments being connected to Vss bus 18. This is sometimes referred to as the "seg 2" decode. As the MSBs are incremented, the final value is reached where all 15 of resistive segments 1-15 are connected to the Vref' bus 16. This is sometimes referred to as the "seg 15" decode.

At this point a further analysis of the FIG. 8 graph of current Iref is helpful. As previously described, when the four MSBs are at the minimum value (0000), all 15 resistive segments are connected to the Vss bus 18 so that the reference current Iref is essentially zero. As previously noted, at the other extreme, when the four MSBs are at a maximum value (1111), all fifteen resistive segments are connected to the Vref' bus 16. Since there is not current path to Vss, current Iref is again zero. These two decodes for the maximum and minimum four MSB inputs are sometime referred to together as "seg 0 & 15". At near the midpoint, nearly half of the resistive segments are connected to Vref' bus 16 with the remainder being connected to the Vss bus 18. This is the maximum Iref current region as shown in FIG. 8. This middle level is produced by what is referred to as the "seg 8 & 7" decode.

Note that in the voltage mode, no current flows into or out of the Vo node. In other words, current I2 of FIG. 5 is always zero. Thus for the minimum digital input, the only current flow into the Vref' bus are the small currents originating from the R-2R LSB section 8B of the converter. This small current is reflected by the left side of the FIG. 8 graph. If it is assumed that the MSB digital input is at a maximum value, then the thermometer code provides a one input to all of the fifteen switches S1 to S15 so that each of the fifteen resistive segments is connected to the reference voltage Vref' bus 16. Since there is no current path to circuit common Vss bus 18, the only reference current is once again a small current that comes from the LSB section 8B of the converter. This small current is reflected by the right side of the FIG. 8 graph. If the MSB input is incremented one step from the minimum value, the thermometer decode will cause one of the fifteen switches to connect one resistive segment to Vref' and all of the remainder of the switches to connect the associated segment to Vss. Thus, a current path from Vref' to Vss is provided having a total resistance of 2R+2R/14. Similarly, when the maximum digital input is decreased by one, all of the resistive segments are connected to Vref except for one. Thus, a current path from Vref' to Vss is again provided, also having a resistance of 2R/14+2R. These increases in currents Iref are reflected on both sides of the symmetrical FIG. 8 graph. The two digital inputs just described produce a pair of decodes referred to as "seg 1 & 14".

Eventually, these increased and decreased digital inputs will approach one another until near half (7) of the resistive segments are connected to Vref' and the remainder (8) are connected to Vss. This creates a current path from Vref' to Vss having a resistance of (2R)/7+2R/8 when seven segments are connected to Vref' and eight segments are connected to Vss and also when eight segments are connected to Vref' and seven segments are connected to Vss. These two midrange digital inputs, having decodes "seg 7 & 8", produce the maximum Iref current shown near the center of the FIG. 8 graph. The above analysis does not take into account the smaller currents produced by the LSBs which operate to increase the Iref current slightly depending upon the digital values.

Figure 9:
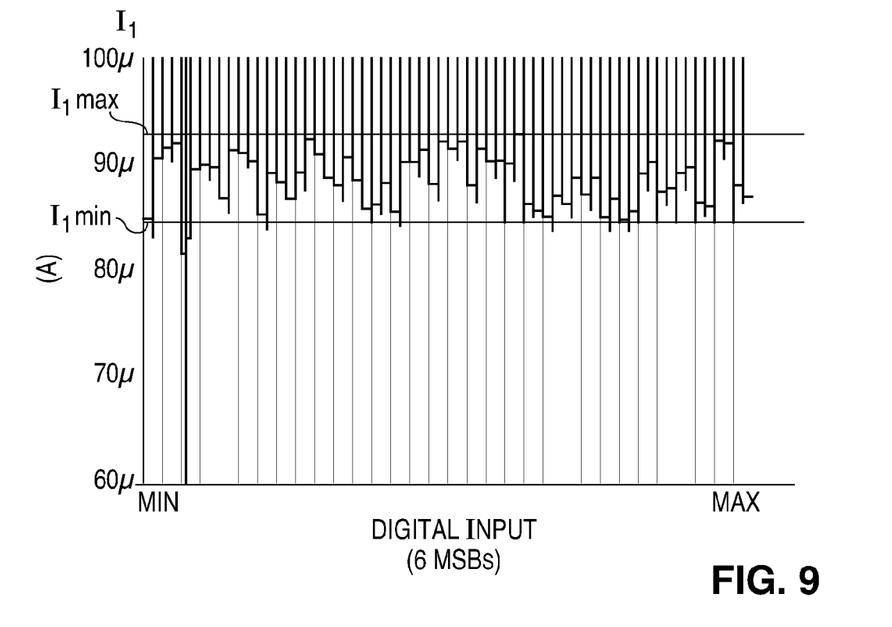
FIG. 9 is a graph depicting a compensated current versus changes in the digital input, with the compensated current having reduced variations which results when a compensating current is combined with the resistor network current of the voltage mode converter.

In order to provide a compensation current Ic1 that is the complement of the Iref currents of the FIG. 8 graph, the same digital inputs applied to the D/A converter are used to control the current compensation circuit 26. Since absolute compensation accuracy is not required, fewer that the full number of bits is adequate. FIG. 9 is a graph showing current I1 after it has been compensated by compensation current Ic1. Without compensation, current I1 is equal to the current Iref of FIG. 8 where, as previously noted, the variation is around 92 µA. With compensation, the variation is reduced to about 8.5 µA as can be seen by the current variation between the I1max value and the I1min value shown in FIG. 9. This reduced variation is less than the 10 µA which would reduce the changes in Vo to less than 5 µV, an acceptable level.

Figure 6:
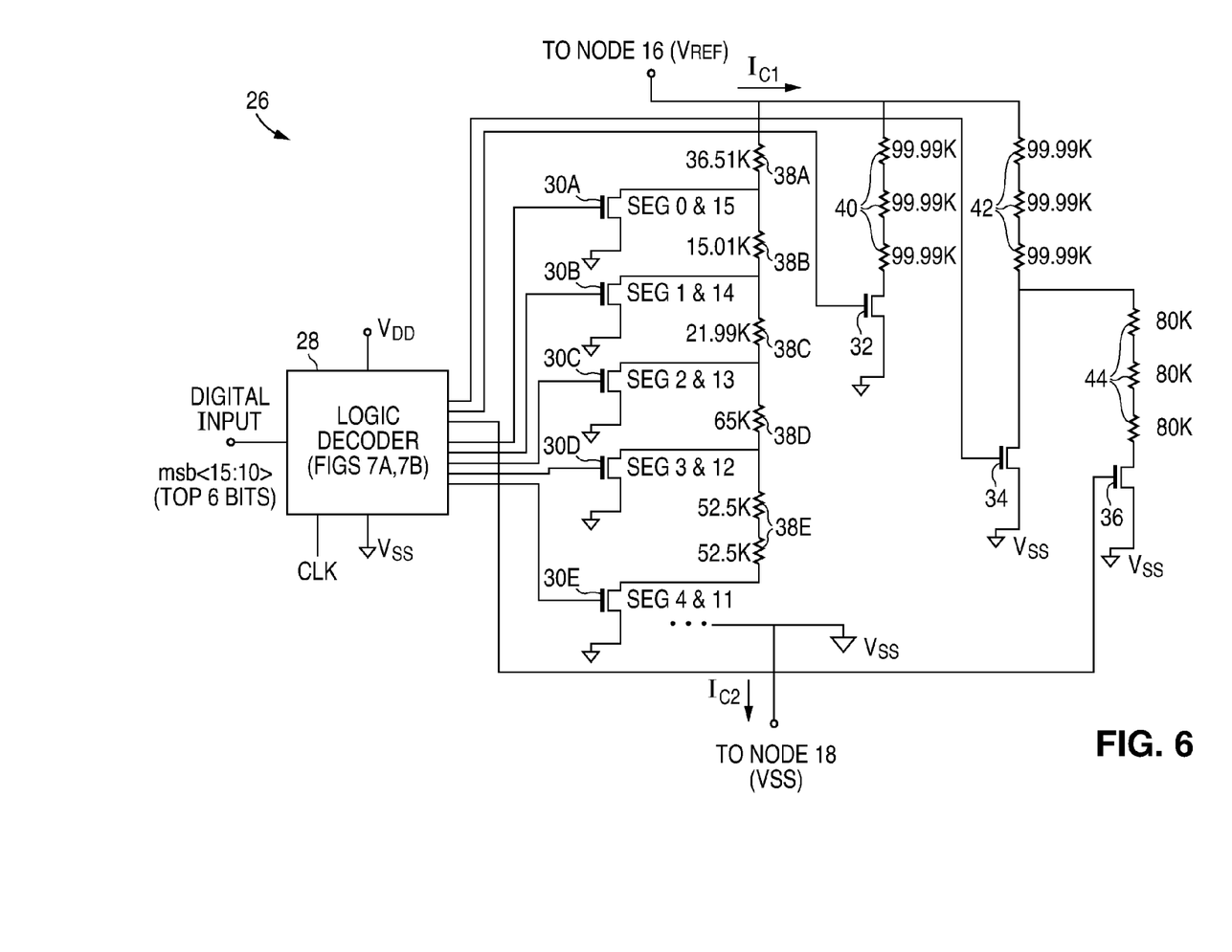
FIG. 6 is a diagram that shows further details of an exemplary implementation of the current compensation circuitry of FIG. 5.
Figure 7A:
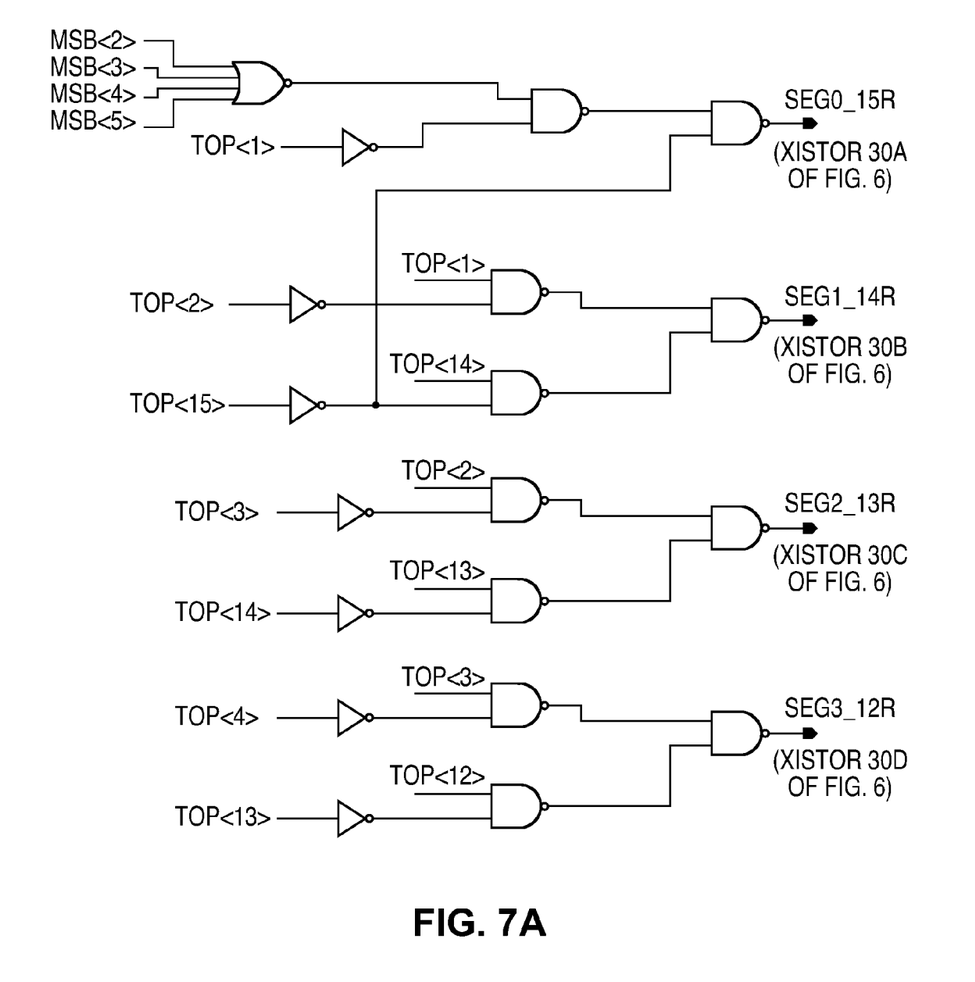
FIGS. 7A-7B show detail of an exemplary implementation of the decoder logic used in the current compensation circuitry of FIG. 6
Figure 7B:
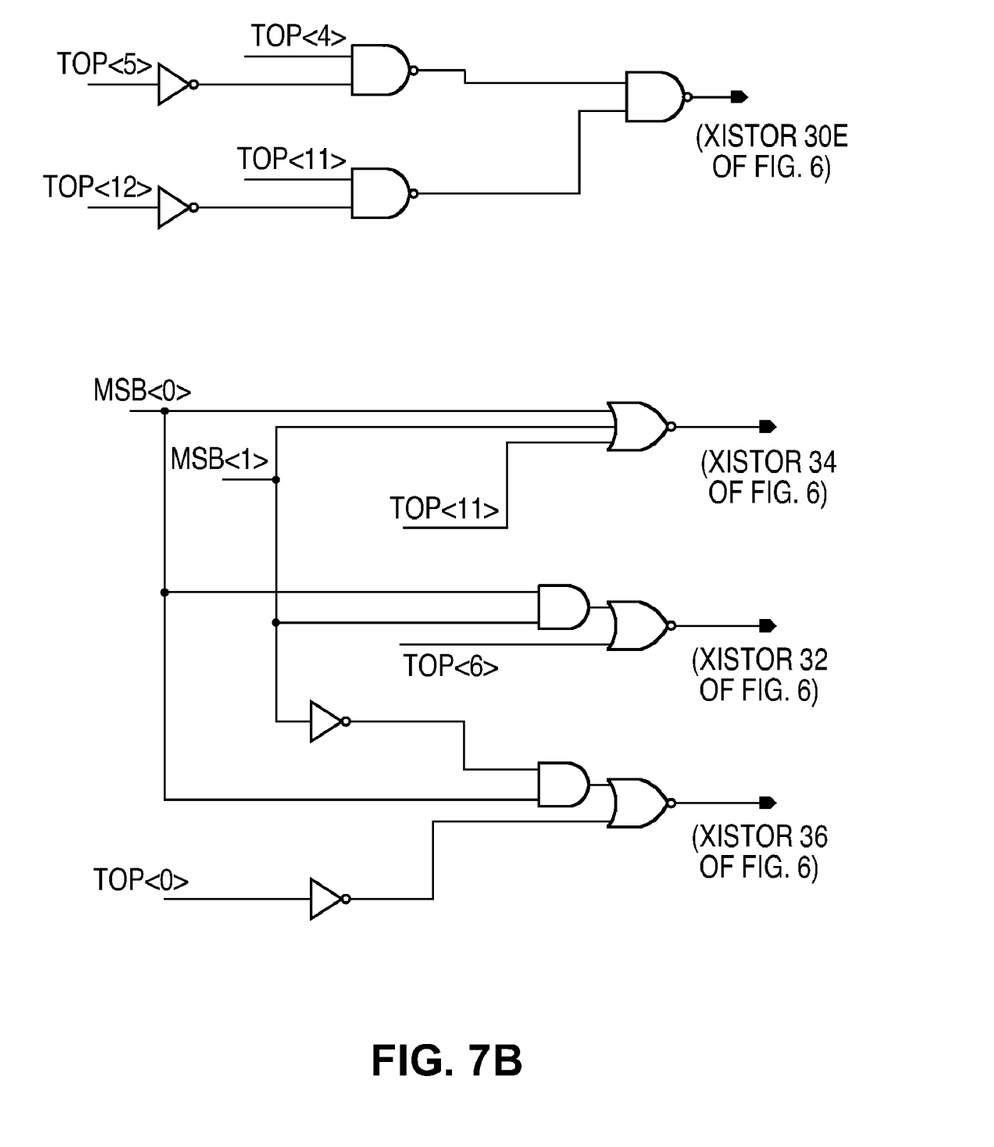

An exemplary compensation circuit 26 is depicted in FIG. 6. The circuit includes a logic decoder circuit 28 which receives the same digital input sent to the D/A converter including four of the converter MSBs and the top two of the converter LSBs, with these six bits sometimes referred to as msb<15:10>. The decoder also utilizes the previously noted fifteen switch (S1 to S15) control signals sometimes referred to as top <15:1> which are part of the D/A converter decoding and which are also derived from msb<15:10>. As can be seen from the detailed logic diagram of FIGS. 7A and 7B, logic decoder 28 is made up of various straightforward combinational logic circuits for controlling the states of the eight switching transistors 30A to 30E and transistors 32, 34 and 36. As confirmed by sizes of the various resistances, transistors 30A to 30E provide the bulk of the compensation currents Ic1, with the three switching transistors 32, 34 and 36 providing smaller compensation currents. These smaller compensation currents are combined with the larger currents, when appropriate, to provide a more precise total compensation current.

As previously described in connection with FIG. 8, for both the minimum and maximum digital values of Iref, the uncompensated current is low, around 12 µA. (The digital sweep depicted does not quite go to the absolute maximum digital input so that the final value of Iref of 12 µA is not shown.) In order to bring the current level of I1 up to the target window intermediate Imin and Imax of FIG. 9, the compensation circuit 26 needs to introduce of current Ic1 to increase the current from around 12 µA to around 85 µA. Essentially the same digital input used to produce the Iref value of 12 µA will be decoded to produce the needed compensation current. Since the 12 µA is produced when digital input is at a minimum value or a maximum value, the logic decoder 28 will decode either value and will activate transistor 30A. Recall that the previously noted designation in FIG. 6 of "seg 0 & 15" designates the two decodes for both the minimum and maximum digital MSB inputs. The decode designations for each further incremental increase/decrease in the four MSBs are "seg 1 & 14", "seg 2 & 13", "seg 3 & 12 and "seg 4 & 11" as also shown in FIG. 6. Note that the current compensator 26 does not use decodes "seg 5 & 10", "seg 6 & 9" or "seg 7 & 8." These six decodes are located in the central portion of the FIG. 8 chart where the rate of change of current is much less than on either side so that current compensation in these regions can be carried out using the LSB decodes.

When the D/A converter receives a minimum/maximum digital input, the logic decoder 28 ("seg 0 & 15") operates to turn on transistor 30A. This causes resistor 38A to be connected Vref, which is around +2.5 volts, and the circuit common Vss. Although the resistor value of 36.15 KΩ is intended to be only exemplary, resistor 38A will conduct a current Ic1 which is almost large enough to translate the Iref current from around 12.5 µA (left and right hand sides of FIG. 8) up to about 80 µA which is near the target window shown in FIG. 9. While decode seg 0 & 15 is active, the decoder will also control the state of transistor 32, 34 and 36 which can, if desired, provide higher resolution compensation currents for more precise compensation.

As the digital input is incremented from the minimum value and/or decremented from the maximum value, the decode logic will produce additional decode pairs "seg 1 & 14", "seg 2 & 13", "seg 3 & 12" and "seg 4 & 11" for controlling the states of transistors 30B-30E along with the decodes for fine adjust current transistors 32, 34 and 36. The decodes and resistance sizes are selected to provide suitable values of compensation current Ic1 to compensate for variations in Iref of FIG. 8 so as to provide a compensated current I1 that remains within the specified range between I1max and I1min.

Note that, as shown in FIG. 5, there is also return current flow from the circuit common or Vss bus 18 of resistor network 8 back to the external reference voltage source 22 and possibly to other locations. Since this return current path from Vss bus 18 in the resistive network 8 back to the external reference voltage source 22 may contain a significant resistance (not depicted), variations in this return reference current I3 will also adversely affect the D/A converter 10A accuracy. This return path may also include an IC terminal 21 similar to terminal 20 in the reference voltage Vref path. Current I3 is equal to variable current I1 since current I2 is zero. Current I3 is compensated by injecting current Ic2 into the Vss bus 18 of the resistor network 8. Given the relationship between I1 and I3, the same compensation current Ic1 used for compensating for variations in Iref (current flow into the resistive network) can be used to compensate for variations in Ivss (current flow out of the resistive network). Since current Ic2 is the only current exiting the compensation circuit 26, currents Ic1 and Ic2 have the same magnitude so that compensation using Ic2 operates to compensate for variations in Ivss. Thus, variations in voltage due to resistances in the line between the Vss bus 18 in resistor network 8 and the circuit common of external reference voltage source 22 are substantially reduced.

Figure 10:
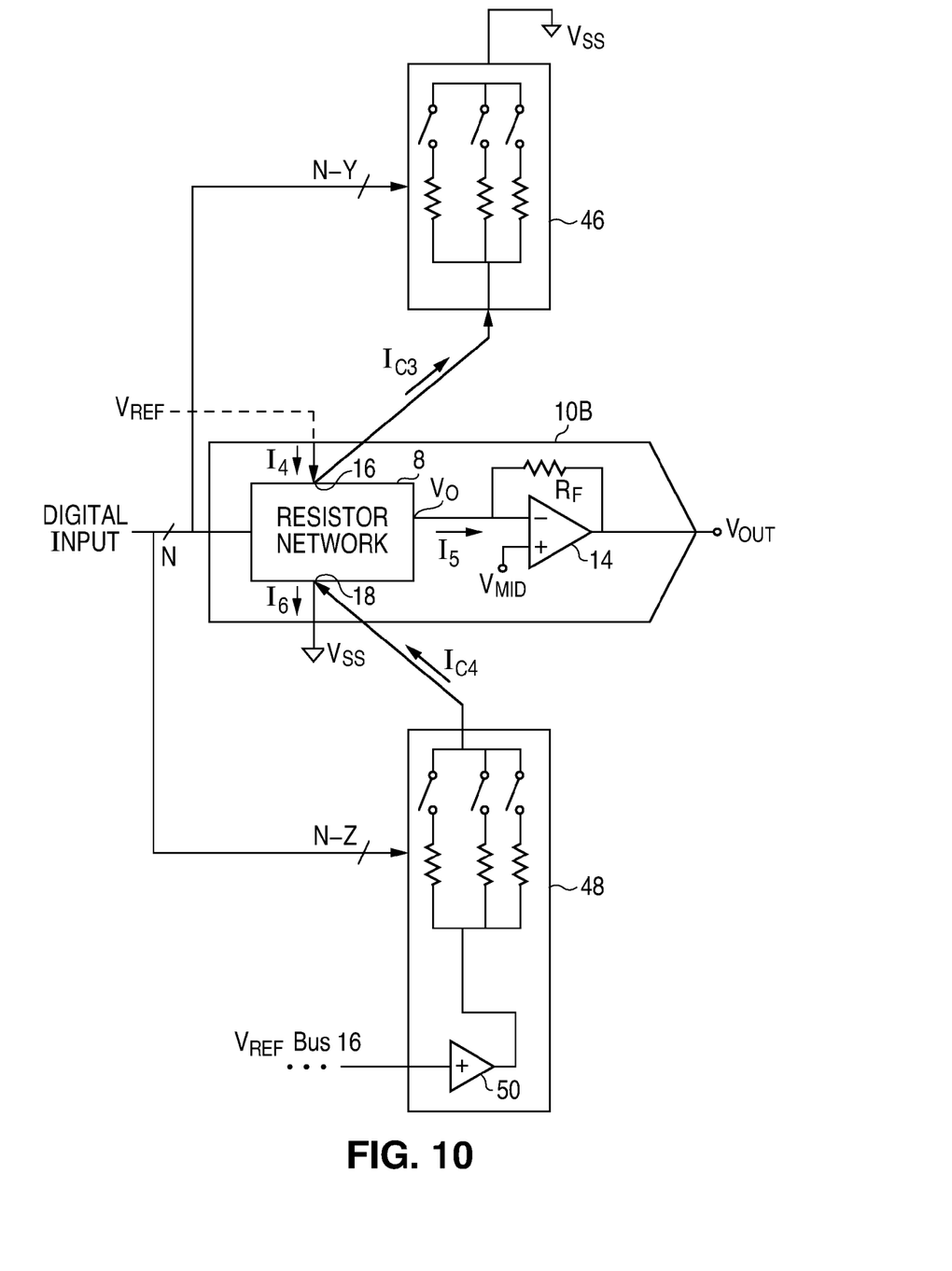
FIG. 10 is a diagram of a current mode D/A converter in accordance with one embodiment of the present invention that utilizes both reference current compensation circuitry and circuit common compensation circuitry.
Figure 13:
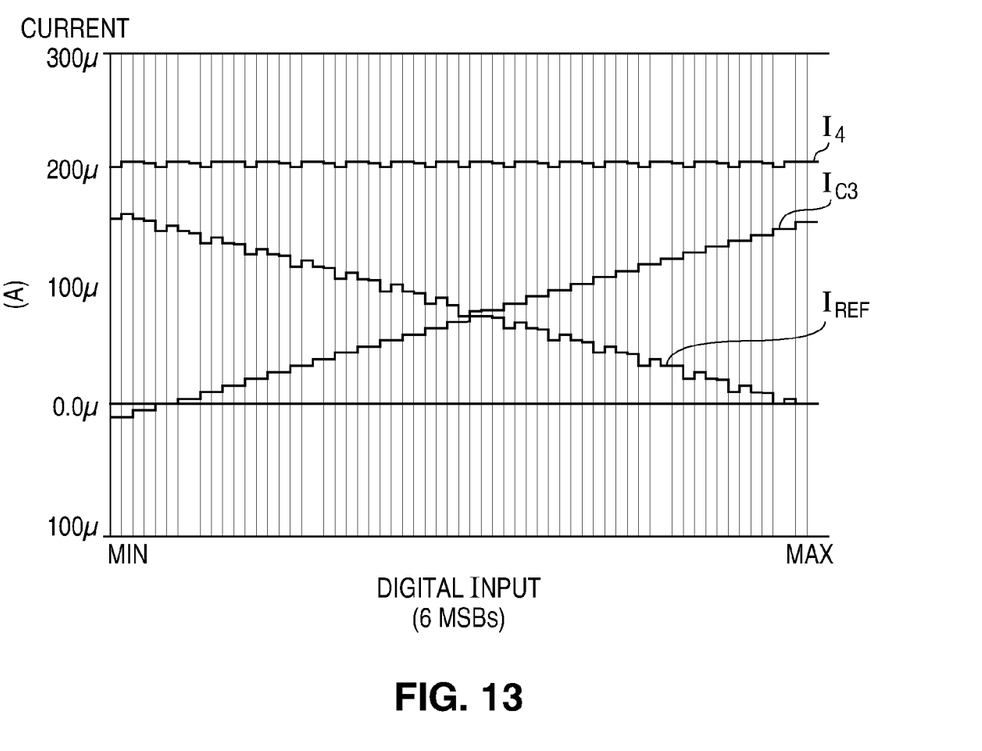
FIG. 13 is a graph depicting the reference current drawn by the resistor network of the current mode D/A converter of FIG. 10 versus changes in the digital input together with the compensating current and combined compensated current, with the compensated current having little variation.

As previously described in connection with FIG. 3, the resistive ladder network 8 can also be configured for current mode operation as shown in FIG. 10. Unlike the voltage mode operation depicted in FIG. 8 where the reference current Iref through the resistive ladder has a non-linear relationship with the digital input, current Iref varies linearly with the digital input as indicated by FIG. 13. Note that the manner in which the resistive network 8 responds to the digital input differs somewhat from that for voltage mode operation. In the case of current mode operation, all of the bits (both MSBs and LSBs) are inverted before they drive switches S1-S15 and switches SR0-SR11 as will be explained.

For any given digital input to the resistive network 8, the network can be reduced to a particular Thevenin equivalent voltage VT (open circuit voltage) and a particular Thevenin equivalent series output resistance RT. Thus resistance RT can be considered to be effectively connected between voltage source VT and the inverting input of amplifier 14. When the digital inputs are mid-range, about half the 2R resistive segments are connected to Vss with the remainder of the segments being connected to Vref (ignoring any difference between Vref and Vref'). Thus, the Thevenin voltage is close to Vref/2. Inspection of converter 10B of FIG. 10 (where neither VT nor RT is depicted) shows that amplifier feedback maintains the inverting amplifier and non-inverting amplifier inputs at the same voltage. Assuming that Vmid has been set to Vref/2, then the voltage at both ends of Thevenin resistance RT is the same so that no current flows through RT. Thus, no current flows through the feedback resistor Rf which is effectively connected in series with RT. Since there is no voltage drop across Rf, the output voltage Vout is equal to Vmid or +Vref/2 for the mid-scale digital input.

When the digital inputs are all ones, output voltage Vout will be at Vref as will be explained. For this maximum digital input, all of the 15 2R resistive segments of converter section 8A are connected to Vss, as are the resistors of the R2R section 8B, with the R2R section forming an effective sixteenth segment having a resistance of 2R. Note that this is the opposite of the previously described voltage mode operation where all segments are connected to Vref for a maximum digital input. When all 16 of the 2R segments are connected to Vss, the equivalent voltage VT is zero and the equivalent resistance RT is 2R/16. Thus, one side of resistance RT is grounded and the other side is at Vo which is held at Vmid, i.e., Vref/2. This will cause a current (Vref/2)/(2R/16) or 4(Vref/R) to flow away from amplifier 14 through resistance RT. That same current will flow through feedback resistor Rf towards the resistive network. Thus, Vout will be equal to the sum of voltage Vmid plus the voltage drop across feedback resistor Rf, with the feedback resistor voltage being 4(Vref/R)Rf. If the value of Rf is set to R/8, then Vout is equal to Vmid+Vref/2 or simply Vref assuming again that Vmid is equal to Vref/2.

For a minimum digital input where the four MSBs are all zeros, all of the 15 resistive segments of section 8A (FIG. 1) are connected to Vref' to give 2R/15. In addition, all of the LSBs are also zero so all of the resistive elements of section 8B (FIG. 1) are also connected to Vref'. As previously noted, the LSB resistive elements together form one segment, segment 0, so that MSBs and LSBs together give 2R/16. As previously noted, this differs from the previously described voltage mode operation where for the minimum digital input all segments are connected to Vss. As a result, the Thevenin voltage VT is Vref and the equivalent resistance RT is 2R/16. Since RT is effectively connected between Vref and Vmid, the current through RT is again (Vref/2)/(2R/16) but flow is in the opposite direction from the maximum digital input case. This current flows through resistance Rf to produce a voltage drop across Rf equal to Vref/2 when Rf is R/8. The voltage drop is subtracted from Vmid, i.e., Vref/2, to produce an output voltage Vout at zero volts. Thus, as is expected, D/A converter 10B produces a linear output Vout with respect to the digital input, with Vout in the present example ranging in voltage from zero to Vref.

It can be seen from the foregoing discussion that for each increment in the MSBs of the digital input causes a 2R segment to be disconnected from Vref and reconnected to Vss. In addition to causing Vout to increase, this causes the current Iref from the reference voltage bus 16 to be reduced by (Vref/2)/2R or Vref/4R. FIG. 13 shows the linear relationship between the MSB digital inputs and current Iref.

Figure 11:
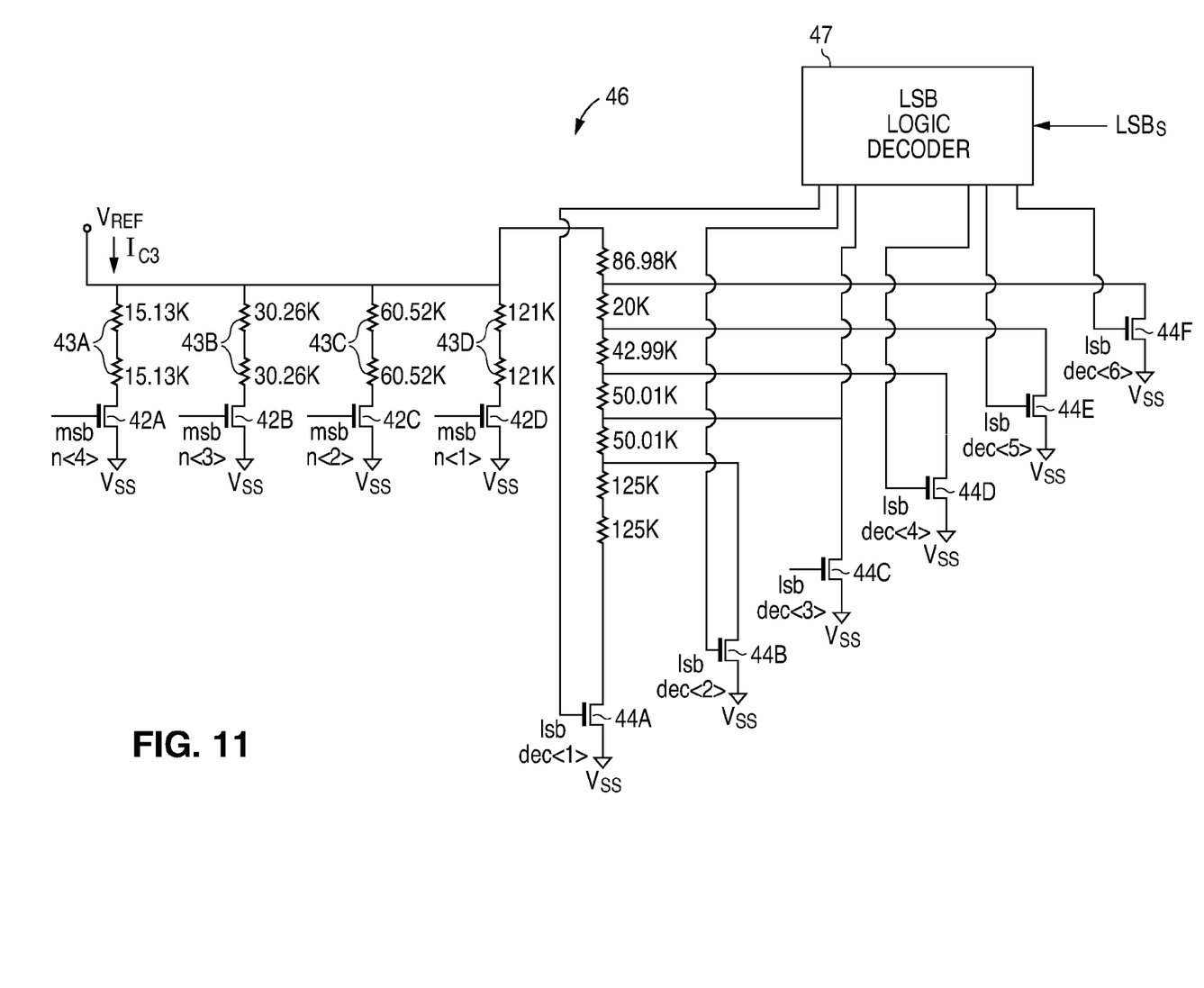
FIG. 11 is a diagram that shows further details of an exemplary implementation of the reference current compensation circuitry of FIG. 10 for the reference voltage node.

In order to compensate for this large variation in Iref, a reference current compensation circuit 46 is provided, as shown in FIG. 11. Circuit 46 produces an essentially linearly increasing compensation current Ic3 as shown in FIG. 13, with each increase in current Ic3 corresponding to a reduction in the reference current Iref as the digital input is incremented. Thus, the combination of Iref and Ic3 produces a relatively constant current I4 (FIG. 10) from the external reference voltage source 22. As a result, the voltage at the Vref' bus 16 is relatively constant.

Further details of the reference current compensation circuit 46 are shown in FIG. 11. In this case a logic decoder is not needed for the MSBs, with the inverse of the four MSB digital inputs (msb n<4>; msb n<3>; msb n<2> and msb n<1>) being applied directly to respective current switching transistors 42A-42D. It can be seen from the respective binary weighted resistance values 43A-43D that, as the inverse MSB values are incremented in a binary fashion, the state of transistors 42A-42D are controlled so that a linearly increasing compensation current Ic3 is produced as shown in FIG. 13. The values of the resistors are selected to provide the appropriate levels of these primary components of the compensation current Ic3.

In order to provide even more accurate compensation, LSB controlled transistors 44A-44F can be used to provide finer currents which are combined with the primary currents provided by transistors 42A-42D. The values of these finer currents are determined by the exemplary resistor values of resistor string 45, with only one of the six transistors 44A-44F being turned by a decoder 47 at any one time. Thus, for example, a maximum value fine current value is produced when transistor 44F is turned on, with a minimum value being produced when transistor 44A is turned on. The number of the fine compensation current adjust transistors 44A-44F and the magnitude of the currents produced depend on the magnitudes of the Iref. The change in Iref being compensated for are small and relatively non-linear changes in current Iref when the LSB of the D/A converter are changed. In order to compensate for these small changes, one preferred approach is to determine the magnitude of the changes by direct measurement on the converter or by using circuit simulation software. Once these small Iref values are determined, it is straightforward to select the appropriate magnitude of the fine currents to be selected by decoder 47 that need to be combined with the primary currents selected by the five MSBs msb n <1>, etc to produce the appropriate compensation current Ic3. Once the appropriate combinations have been ascertained, it is straightforward to provide the needed combinational logic as previously demonstrated by the combinational logic of FIGS. 7A and 7B for decoder 28. The particular details regarding the implementation of LSB decoder 47 can be readily carried out by those skilled in the art for a particular D/A converter once the necessary compensation current magnitudes have been ascertained. Further, any particular decoder implementation will generally be applicable to only the particular converter measured/simulated and will have essentially no application to converters in general. Thus, further details regarding the LSB decoder 47 are not provided.

In order to compensate for variations in current Ivss out of the resistive ladder network, it is not possible to use the reference current compensation circuit 46 to also function as a circuit common reference circuit as was done for voltage mode operation as previously described in connection with FIG. 5. That is because for voltage mode operation, the variable current Iref exiting the Vref' bus 16 and through the network 8 will be equal to the variable current Ivss exiting the network to Vss bus 18 with current I2 being zero. That is not the case for the FIG. 10 current mode operation.

For current mode operation (FIG. 10), a current I5 does flow through the Vo node, with this current actually producing the D/A converter 10B output. As previously described, the output Vo of the converter 10B ladder network is connected to the input of amplifier 14 which provides feedback which maintains Vo at a mid-voltage point such as Vref'/2. Amplifier 14 provides a variable output current through resistor Rf to Vo to maintain this voltage, with a portion of this current flowing through the resistive network to the Vss bus 18. For example, at the maximum digital input all fifteen resistive segments (segments 1-15) are connected by the fifteen switches S1 to S15 to the Vss bus 18 rather than the Vref' bus 16 to provide an effective resistance of 2R/15. In addition, all of the LSB resistive elements (segment 0) are connected to the Vss bus 18 to provide an effective resistance of 2R. Thus, the combined resistance is 2R/16. Accordingly, essentially no reference current Iref will flow. Instead, current I5 (FIG. 3) will flow from Vo through the sixteen parallel 2R resistive segments to the Vss bus 18. The current level Ivss through the Vss bus 18 will be (Vref'/2)/(2R/16). Thus, unlike the voltage mode configuration, there is current flow to the Vss bus 18 in the current mode configuration which did not originate from the reference voltage source 22. If the MSBs of the digital input are decremented one time, the number of resistive segments connected to Vss will drop from 16 to 15 thereby reducing the Ivss current from this maximum value by (Vref'/2)/2R. This unit of Ivss reduction will continue as the digital input decreases until the minimum digital value where all of the resistive segments are connected to Vref. In that case, all of the current originating from Vref will flow into the output of amplifier 14 and not to the Vss bus 18 so that Ivss will be zero.

Thus, current Ivss is a linearly increasing current, starting at a minimal value for the minimum digital input and reaching a maximum value at the maximum digital input. In order to compensate for this variation in current Ivss, a compensation current Ic4 is introduced into the Vss bus 18 of the resistive ladder 8 by a compensation current circuit 48 as shown in FIG. 10. Compensation current Ic4 should start at a large value for the minimum digital inputs and linearly decrease in value up to the maximum digital input, with the magnitude being appropriate to produce a composite current I6 with minimum variations.

Figure 12:
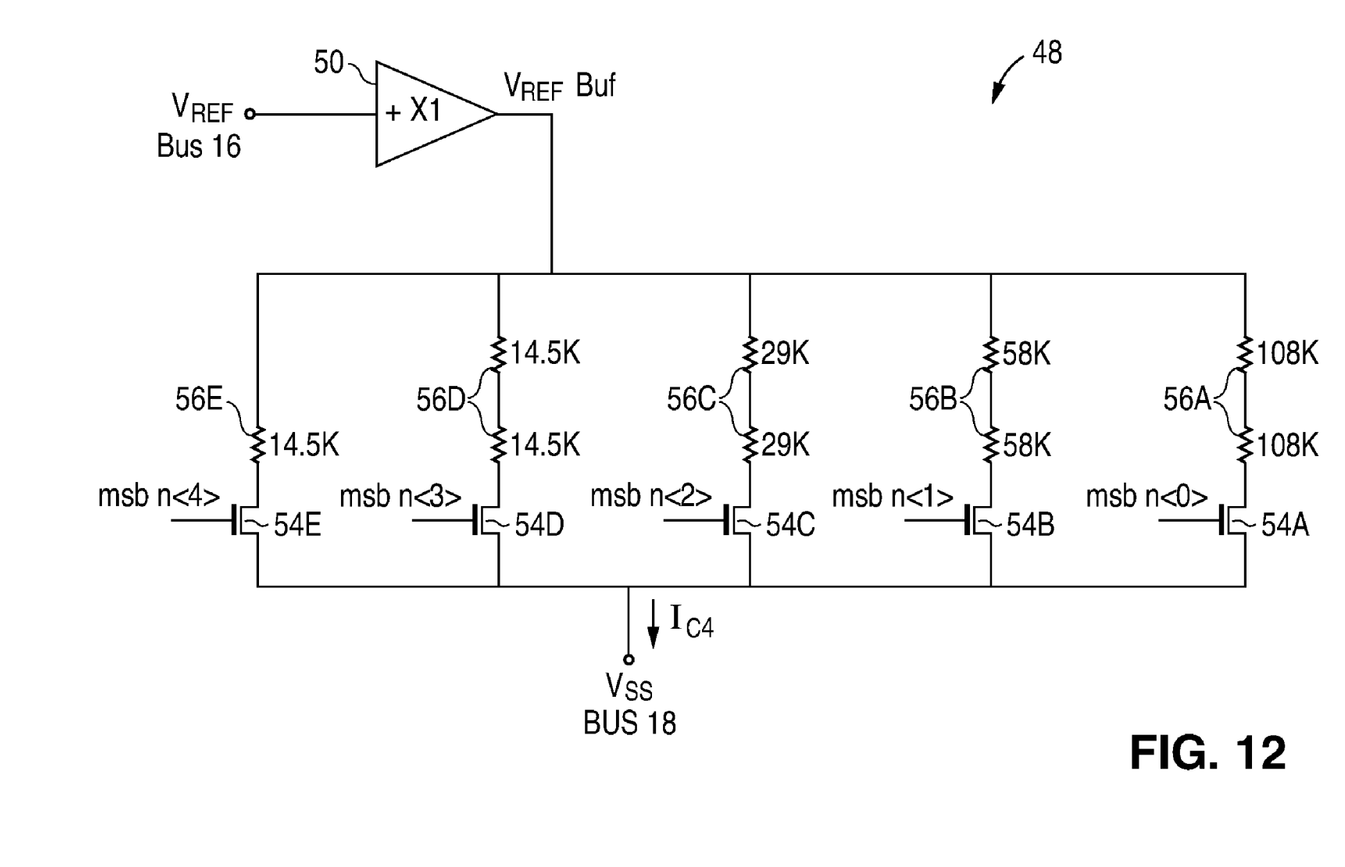
FIG. 12 is a diagram that shows further details of an exemplary implementation of the circuit common current compensation circuitry of FIG. 10 for the circuit common node.

FIG. 12 is a diagram of an exemplary circuit common compensation current circuit 48. The circuit requires a reference voltage Vref to track the reference voltage used in the resistive ladder network 8. However, in order to avoid loading the reference voltage source 22 and thus disturbing the compensation provided by the reference current compensation circuit 46, a unity gain buffer 50 is used to provide a buffered voltage Vref Buf. Because the resistance of the Vss path is generally small, an error of a few percent in buffer 50 is easily tolerated. Hence, buffer 50 can be small and use little power. This is in contrast to buffer 24 (FIG. 4) of the prior art which must have a very low offset voltage and fast response. Hence buffer 24 must be large (for high accuracy) and draw substantial current. Note also that is some cases where the Vss resistance is very low, the Ivss current compensation circuit 48 may be omitted entirely.

Given the linear nature of the required compensation current Ic4, a logic decoder is not needed, with the D/A converter five MSB digital inputs being used directly in inverted form (msb n<4>; msb n<3>; msb n<2>; msb n<1>; and msb n<0>) to control the states of five transistors 54A to 54E. These transistors selectively ground respective resistances 56A to 56E to produce a current contribution to Ic4 based upon the resistive values. As indicated in FIG. 12, these exemplary resistive values are binary weighted so that sixty-four different compensating currents Ic4 can be produced. Current Ic4 starts at a maximum value for the minimum digital inputs and ends at a minimum value for the maximum digital input. Thus, when the digital input is at a minimum value, all of transistors 54A to 54E are turned on to produce a maximum value of Ic4 to compensate for the zero value of Ivss. When the digital input is incremented, transistor 54A is turned off with the remaining transistors remaining on. When incremented still further, transistor 54B is turned off with the remaining transistors being on. As this incrementing continues, eventually all of the transistors are off.

Note that any degree of compensation will operate to enhance converter accuracy. Assume that a current to be compensated for flows at a compensation node (Iref for example), along with a compensating current (Ic1 for example) and a compensated current (I1 for example). It is preferred that the compensating current Ic1 be controlled such that any variation in the compensated current I1 will be less than one-half the variation in the current to be compensated for (Iref). By way of example, assume that current Iref within resistor network 8 of FIG. 5 varies with respect to changes in the digital input by a peak-to-peak value of 80 μA. It is preferred that the compensation current Ic1 be such that any variations in current I1 will be less than one-half of 80 μA, that is, less than 40 μA. By way of a further example, assume that current Ivss within resistor network 8 of FIG. 10 varies with respect to changes in the digital input by a peak-to-peak value of 50 μA. It is preferred that the compensation current Ic4 be such that any variations of current I6 will be less than one-half of 50 μA, that is, less than 25 μA. Furthermore, the present invention is particularly applicable to all kinds of digital circuits, such as D/A converters, that are of a relatively high resolution such as having a resolution of at least eight bits. In that case, the compensating current should be digitally controlled by circuitry responsive to at least three of those eight bits.

Thus, various embodiments of an D/A converter having current compensation have been disclosed. Although these embodiment have been described in some detail, it is to be understood that various changes can be made by those skilled in the art without departing from the spirit and scope of the present invention as defined by the appended claims.

What is claimed is:

1. A D/A converter comprising:
    a converter network including a network reference bus to be connected to a reference node by way of a first electrical connection, with the converter network being configured to produce a series of reference outputs derived from the reference voltage in response to a digital input applied to the converter, with the converter network producing a network reference current at the network reference bus which varies with the converter digital input; and
    a reference current compensator circuit configured to provide a reference compensation current at the network reference bus having a magnitude which varies in response to at least a portion of the digital input, with the reference compensation current operating to reduce variations in magnitude of current through the first electrical connection between the reference bus and the reference node caused by changes in the digital input.

2. The D/A converter of claim 1 wherein the converter network is implemented in an integrated circuit having electrical terminals and wherein the first electrical connection includes one of the electrical terminals.

3. The D/A converter of claim 1 further including a common node and wherein the converter network includes a network common bus, with the converter network producing a network common current to the network common bus which varies in magnitude with the converter digital input and wherein the network common bus is to be connected to the common node by a second electrical connection; and
    a common current compensation circuit configured to provide a common compensation current at the network common bus having a magnitude which varies in response to at least a portion of the digital input, with the common compensation current operating to reduce variations in magnitude of current through the second electrical connection between the common bus and the common node caused by changes in the digital input.

4. The D/A converter of claim 3 wherein the converter network is implemented in an integrated circuit having electrical terminals and wherein the second electrical connection includes one of the electrical terminals.

5. A circuit arrangement comprising:
    a compensated circuit which produces a varying current at a first node of the compensated circuit, with the varying current having variations in magnitude in response to a digital input to the compensated circuit, with the digital input comprising at least three bits and wherein the first node is to be connected to a second node by way of a first electrical connection; and
    a compensating circuit that produces a compensating current at the first node, with the compensating current having a magnitude controlled by at least three bits of the digital input to the compensated circuit and having a direction so that variations in magnitude of current through the first electrical connection are reduced as compared to the variations in magnitude of the varying current and so that variations of a voltage at the first node are reduced.

6. The circuit arrangement of claim 5 wherein the variations in magnitude of the current in the first electrical connection are less than one-half the variations in magnitude of the varying current.

7. The circuit arrangement of claim 5 wherein the compensated circuit is implemented in integrated circuit form and wherein the electrical connection includes an electrical terminal of the integrated circuit.

8. The circuit arrangement of claim 5 wherein the compensated circuit sources the varying current into the first node, the compensating circuit sources the compensating current into the first node and the current through the first electrical connection is away from the first node.

9. The circuit arrangement of claim 5 wherein the compensated circuit sources the varying current away from the first node, the compensating circuit sources the compensating current away from the first node and the current in the first electrical connection is towards the first node.

10. The circuit arrangement of claim 5 wherein at least part of the digital input to the compensated circuit is provided to the compensating circuit, with the compensating circuit produces the compensating current by converting the at least part of the digital input into analog currents.

11. The circuit arrangement of claim 5 wherein the compensated circuit includes a resistor network of an D/A converter and the first node is for receiving a reference voltage originating from a reference voltage source by way of the first electrical connection.

* * * * *